US 6,707,150 B1

United States Patent
Lee

(10) Patent No.: US 6,707,150 B1
(45) Date of Patent: Mar. 16, 2004

(54) PACKAGE SUPPORT MEMBER WITH HIGH HEAT-REMOVING ABILITY

(75) Inventor: Julian Lee, Taipei Hsien (TW)

(73) Assignee: Galaxy PCB Co., Ltd., Taoyuan Hsien (TW)

( * ) Notice: Subject to any disclaimer, the term of this patent is extended or adjusted under 35 U.S.C. 154(b) by 0 days.

(21) Appl. No.: 10/280,548

(22) Filed: Oct. 24, 2002

(51) Int. Cl.[7] .............................................. H01L 23/04
(52) U.S. Cl. ...................................... 257/730; 257/622
(58) Field of Search ................................ 257/625, 622, 257/621, 730, 698, 697, 733

(56) References Cited

U.S. PATENT DOCUMENTS 6,204,555 B1 * 3/2001 Iovdalsky .................... 257/728
2003/0038292 A1 * 2/2003 Wang et al. ................... 257/81
2003/0094697 A1 * 5/2003 Higashida et al. .......... 257/758

* cited by examiner

*Primary Examiner*—Phat X. Cao
(74) *Attorney, Agent, or Firm*—Pro-Techtor International Services

(57) ABSTRACT

A support member for packaging a light-emitting element is provided at a top with a cup-shaped recess, which has a flat bearing bottom surface and a curved inner wall surface for stably bearing the light-emitting element therein. The support member is also provided with a plurality of venting and heat-dissipating holes irregularly distributed around the cup-shaped recess. A temperature difference between any two of these venting and heat-dissipating holes produces a minor turbulent airflow to naturally and quickly dissipate heat produced by the light-emitting element, so that a temperature rise of the light-emitting element is effectively reduced to maintain normal operation of the light-emitting element without decreasing the usable life and reliability thereof.

4 Claims, 1 Drawing Sheet

PACKAGE SUPPORT MEMBER WITH HIGH HEAT-REMOVING ABILITY

FIELD OF THE INVENTION

The present invention relates to a package support member for a light-emitting element, and more particularly to a package support member for a light emitting diode (LED).

BACKGROUND OF THE INVENTION

A light emitting diode is a bonded diode mainly consisting of multiple layers of p-type crystals and multiple layers of n-type crystals formed on a substrate to provide a semiconductor. After the multi-layer crystalline structure of the diode is formed, it is cut into small dies that are then fixed onto a flat member. The small dies are subjected to wire bonding and then packaged to form an LED bulb.

There are various kinds of light emitting diodes that are employed in a variety of applications and have become an important and necessary item in the modern life. Light emitting diodes are normally used as illuminating and warning devices. When the light emitting diode converts electric power into light to achieve the illuminating or warning function, it generates heat and results in rise of temperature thereof. The light emitting diode has a brightness that reduces by 0.9% when the temperature of the light emitting diode rises by 1° C. From this fact, it can be seen how important a temperature-rise effect is to the brightness of the light emitting diode. It is therefore an important issue to effectively remove heat from the light emitting diode to maintain the latter at a desired brightness.

There has never been any effective heat-removing means or structure for a support member of a light-emitting element in the form of a light emitting diode. Thus, the light-emitting element tends to have reduced brightness and shortened usable life after being used for a period of time due to the high temperature rise of the light-emitting element.

There are generally two types of packages for the light-emitting element, namely, a frame-type and a COB-type package. In the frame-type package, the package support member is unable to support a big-size light-emitting element. And, in the COB-type package, the support member is unable to support a high-power light-emitting element. Therefore, both the conventional frame-type and COB-type packages are not suitable for supporting the light-emitting elements that have big size and high power for use, for example, with a traffic light.

SUMMARY OF THE INVENTION

It is therefore a primary object of the present invention to provide a package support member with high heat-removing ability to effectively reduce the temperature rise of a light-emitting element packaged therein and accordingly maintain the brightness and usable life of the light-emitting element.

In one aspect of the present invention, there is provided a package support member with high heat-removing ability for packaging a light-emitting element. The support member includes a plurality of alternately disposed thermally and electrically conducting layers and insulating layers. A plurality of through holes are irregularly provided on the support member to serve as venting and heat-dissipating holes. With temperature differences among the venting and heat-dissipating holes that have different heat accumulating and dissipating abilities, minor turbulent airflows are produced in the support member to naturally dissipate the heat produced by the light-emitting element without using additional external heat-radiating means. The light-emitting element therefore has a reduced temperature rise to maintain its brightness and usable life.

In another aspect of the present invention, there is provided a package support member with high heat-removing ability for packaging a light-emitting element. The support member includes a plurality of alternately disposed thermally and electrically conducting layers and insulating layers. The support member is provided at a top with a cup-shaped recess, in which a light-emitting element is packaged. The recess provides good bearing environments for the light-emitting element, and the problem with the general frame-type package support member of being unable to bear a big-size light-emitting element and the problem with the general COB-type package of being unable to bear a high-power (that is, big current) light-emitting element all can be overcome.

In a further aspect of the present invention, there is provided a package support member with high heat-removing ability for packaging a light-emitting element. The support member includes a plurality of alternately disposed thermally and electrically conducting layers and insulating layers. The support member is provided at a top with a cup-shaped recess, in which a light-emitting element is packaged. The recess includes a bearing bottom surface having an even coarseness to facilitate stable positioning of the light-emitting element therein. The light-emitting element disposed in the recess does not tip over and an image thereof could be more easily captured to enable upgraded production efficiency thereof.

In a still further aspect of the present invention, there is provided a package support member with high heat-removing ability for packaging a light-emitting element. The support member includes a plurality of alternately disposed thermally and electrically conducting layers and insulating layers. The support member is provided at a top with a cup-shaped recess, in which a light-emitting element is packaged. The recess includes a curved inner wall surface capable of total reflection of light emitted from the light-emitting element, so that the recess could focus and then evenly scatters parallel light to increase usable light quantity and avoid diffusion and diffraction of the light source.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
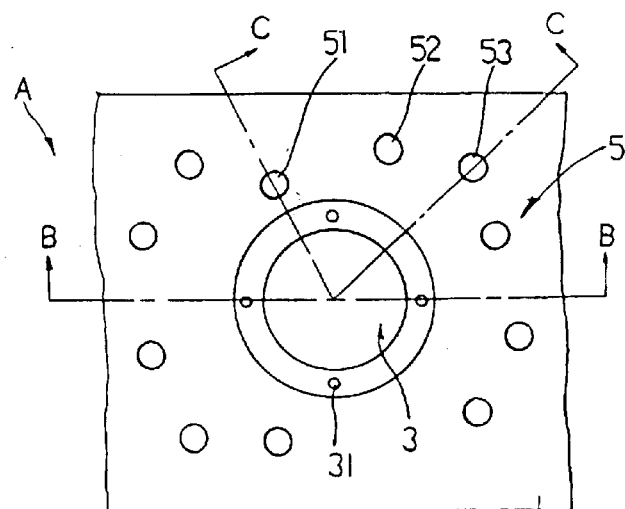
FIG. 1 is a top plan view of a package support member with high heat-removing ability according to a preferred embodiment of the present invention.
Figure 2:
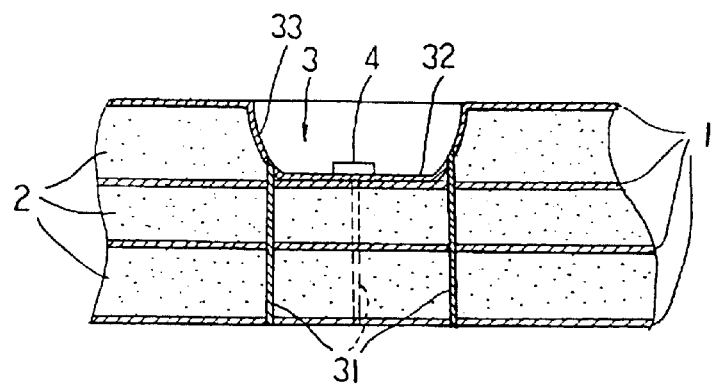
FIG. 2 is a sectional view taken along line B—B of FIG. 1.
Figure 3:
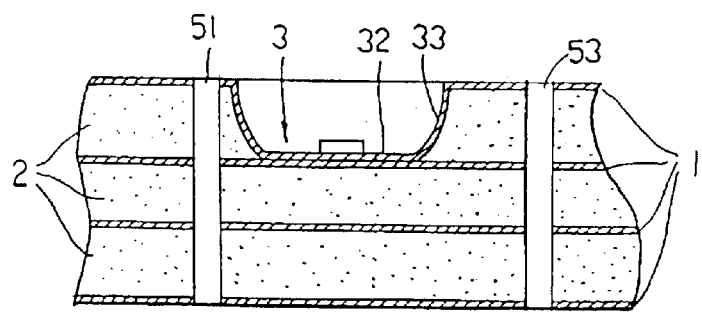
FIG. 3 is a sectional view taken along line C—C of FIG. 1.

Please refer to FIGS. 1, 2, and 3 which together shows a package support member A with high heat-removing ability for packaging a light-emitting element 4. The package support member A is provided at a top with a cup-shaped recess 3 that has a flat bearing bottom surface 32 and a curved inner wall surface 33 for bearing a light-emitting element 4 therein. The support member A is provided with a plurality of through holes that are irregularly distributed over the support member A to serve as venting and heat-dissipating holes 5, so that heat produced by the light-emitting element 4 is naturally dissipated via these venting and heat-dissipating holes 5 to effectively reduce a temperature rise of the light-emitting element.

FIG. 1 is a top plan view of the package support member A with high heat-removing ability according to a preferred embodiment of the present invention; FIG. 2 is a sectional view taken along line B—B of FIG. 1; and FIG. 3 is a sectional view taken along line C—C of FIG. 1. The present invention will now be described in more details with reference to FIGS. 1 to 3.

As shown in the drawings, the package support member A, which may be, for example, a printed circuit board, includes a plurality of alternately disposed thermally and electrically conducting layers 1 and insulating layers 2. In the illustrated drawings, four layers 1 and three layers 2 are shown. The thermally and electrically conducting layers 1 and the insulating layers 2 maybe bonded together in any acceptable manner, such as, for example, being directly compressed and bonded together. The thermally and electrically conducting layers 1 may be any one of gold, silver, aluminum, nickel, indium, platinum, copper, and zinc, and alloys thereof.

The support member A is provided at the top with at least one cup-shaped recess 3 for one light-emitting element 4 to seat on the bearing bottom surface 32 of the recess 3. The light-emitting element 4 may be a semiconductor light emitting diode. The present invention will be described by taking the light emitting diode as an example. However, it is understood any light-emitting element that has the function of emitting light shall be included in the scope of the present invention. The cup-shaped recess 3 is provided at predetermined positions with at least one heat-conducting post 31 vertically extended through all the thermally and electrically conducting layers 1 and insulating layers 2. Moreover, the support member A is provided on the layers 1 and the layers 2 around the cup-shaped recess 3 with a plurality of irregularly distributed venting and heat-dissipating holes 5 that also extend through all the layers 1 and 2.

When the light-emitting element 4 is used as an illuminating device and produces high amount of heat, the produced heat is conducted to the venting and heat-dissipating holes 5 via the heat-conducting posts 31 and the thermally and electrically conducting layers 1. The venting and heat-dissipating holes 5 have different heat-accumulation temperatures, depending on a distance between their respective position and the cup-shaped recess 3. For example, one of the venting and heat-dissipating holes 5, denoted by numeral reference of 51, which is closest to the recess 3, has a heat-accumulation temperature of 70° C. Meanwhile, another venting and heat-dissipating holes 52 that is next close to the recess 3 has a heat-accumulation temperature of 60° C., and a venting and heat-dissipating hole 53 that is furthest from the recess 3 has a heat-accumulation temperature of 50° C. Therefore, there are temperature differences between different venting and heat-dissipating holes 5 due to different heat-accumulation temperatures thereof. Such temperature differences produce minor turbulent airflows in the recess 3 and the venting and heat-dissipating holes 5 to enable natural, quick, and balanced dissipation of heat from the support member A without any external heat-radiating means. The temperature rise of the light-emitting element 4 is therefore reduced to enable maintenance of an initial brightness and usable life of the light-emitting element 4. That is, the light-emitting element 4 can operate in a normal state without decreasing its life and reliability.

The cup-shaped recess 3 provided on the support member A for packaging the light-emitting element 4 provides good bearing environments for the light-emitting element 4. The bearing bottom surface 32 of the recess 3 has even coarseness to facilitate stable positioning of the light-emitting element 4 in the recess 3 without tipping over, so that it is more easily to capture the image of the light-emitting element 4 and to enhance the production efficiency thereof.

The cup-shaped recess 3 provided on the support member A is further provided with a curved inner wall surface 33 that is capable of total reflection of light emitted from the light-emitting element 4, so that the recess 3 is capable of focusing light and then evenly scattering parallel light. The recess 3 not only increases the usable light quantity, but also enables the transmitted beam to have good brightness distribution and avoids unnecessary waste of valuable light source due to diffusion and diffraction.

In brief, the present invention provides a package support member with high heat-removing ability. The support member not only provides good bearing environments for the light-emitting element and enhanced lighting effect, but also enables natural, quick, and balanced dissipation of heat produced by the light-emitting element without using any external heat-radiating means. The temperature rise of the light-emitting element is reduced to enable normal operation of the light-emitting element without decreasing its life and reliability.

The present invention has been described with a preferred embodiment thereof and it is understood that many changes and modifications in the described embodiment can be carried out without departing from the scope and the spirit of the invention as defined by the appended claims.

What is claimed is:

1. A package support member with high heat-removing ability for packaging a light-emitting element, comprising:
   a plurality of thermally and electrically conducting layers;
   a plurality of insulating layers alternating with said a plurality of thermally and electrically conducting layers;
   at least one cup-shaped recess provided at a top of said support member for bearing said light-emitting element therein, said cup-shaped recess being provided at predetermined positions with at least one heat-conducting post, which vertically extends through said thermally and electrically conducting layers and said insulating layers; and
   a plurality of venting and heat-dissipating holes irregularly distributed over said support member around said cup-shaped recess to vertically extend through said thermally and electrically conducting layers and said insulating layers.

2. The package support member with high heat-removing ability as claimed in claim 1, wherein said cup-shaped recess has a bearing bottom surface with an even coarseness.

3. The package support member with high heat-removing ability as claimed in claim 1, wherein said cup-shaped recess has a curved inner wall surface.

4. The package support member with high heat-removing ability as claimed in claim 2, wherein said cup-shaped recess has a curved inner wall surface.

* * * * *